United States Patent
Li et al.

(10) Patent No.: US 10,957,564 B2
(45) Date of Patent: Mar. 23, 2021

(54) SELF-CALIBRATION APPARATUS AND METHOD FOR REAL-TIME TEMPERATURE MEASUREMENT SYSTEM OF MOCVD DEVICE

(71) Applicant: AK OPTICS TECHNOLOGY CO., LTD., Beijing (CN)

(72) Inventors: Chengmin Li, Beijing (CN); Dong Yan, Beijing (CN); Linzi Wang, Beijing (CN); Jianpeng Liu, Beijing (CN); Hongda Jiao, Beijing (CN); Tang Zhang, Beijing (CN); Xiaochao Ma, Beijing (CN)

(73) Assignee: AK OPTICS TECHNOLOGY CO., LTD., Beijing (CN)

( * ) Notice: Subject to any disclaimer, the term of this patent is extended or adjusted under 35 U.S.C. 154(b) by 614 days.

(21) Appl. No.: 16/319,323

(22) PCT Filed: Aug. 19, 2014

(86) PCT No.: PCT/CN2014/084682
§ 371 (c)(1),
(2) Date: Jan. 19, 2019

(87) PCT Pub. No.: WO2015/081727
PCT Pub. Date: Jun. 11, 2015

(65) Prior Publication Data
US 2019/0237348 A1    Aug. 1, 2019

(30) Foreign Application Priority Data

Dec. 6, 2013 (CN) .......................... 201310655598.3

(51) Int. Cl.
*C30B 25/10* (2006.01)
*H01L 21/67* (2006.01)
(Continued)

(52) U.S. Cl.
CPC ...... *H01L 21/67248* (2013.01); *G01J 5/0007* (2013.01); *G01J 5/0896* (2013.01); *G01J 5/60* (2013.01); *G01J 2005/0048* (2013.01)

(58) Field of Classification Search
CPC .......... C30B 21/00; C30B 25/00; C30B 25/10
See application file for complete search history.

(56) References Cited

U.S. PATENT DOCUMENTS 5,748,319 A * 5/1998 Baek .................. G01B 11/0683
356/630
6,215,106 B1 * 4/2001 Boas .................... C23C 16/4401
118/724
(Continued)

FOREIGN PATENT DOCUMENTS

CN    102889934 A    1/2013
CN    103411684 A    11/2013

OTHER PUBLICATIONS

Chinese Office Action dated Apr. 6, 2017 for the corresponding Chinese patent application.

*Primary Examiner* — Robert M Kunemund
(74) *Attorney, Agent, or Firm* — Platinum Intellectual Property LLP

(57) ABSTRACT

A self-calibration apparatus and method for a real-time temperature measurement system of a MOCVD device belong to the technical field of semiconductor manufacturing. The apparatus comprises a MOCVD reactor chamber (1) and an optical detector (6). The MOCVD reactor chamber (1) comprises an epitaxial wafer (4). A detection window (5) is provided on the top of the MOCVD reactor chamber (1). The optical detector (6) emits detection light beams whose wavelengths are respectively λ1 and λ2 toward the epitaxial wafer (4) through the detection window (5). The detection light beams are reflected by the epitaxial wafer (4) to form reflected light beams which are detected by the (Continued)

optical detector (6). In the method, points corresponding to the actual thermal radiation ratios are depicted on the theoretical thermal radiation ratio-temperature curve according to actual thermal radiation ratios, and values of the temperatures T corresponding to the points are substituted into formulas to obtain m1 and m2 respectively. With the method and apparatus, self-calibration of the real-time temperature measurement system of a MOCVD device is realized, thus ensuring consistent and accurate measurements of a growth temperature of the epitaxial wafer.

16 Claims, 2 Drawing Sheets

(51) Int. Cl.
*G01J 5/08* (2006.01)
*G01J 5/00* (2006.01)
*G01J 5/60* (2006.01)

(56) References Cited

U.S. PATENT DOCUMENTS

| 2008/0124453 A1* | 5/2008 | Bour | C23C 16/52 |
|---|---|---|---|
| | | | 427/10 |
| 2013/0167769 A1* | 7/2013 | Shamoun | C30B 25/16 |
| | | | 117/86 |

* cited by examiner

SELF-CALIBRATION APPARATUS AND METHOD FOR REAL-TIME TEMPERATURE MEASUREMENT SYSTEM OF MOCVD DEVICE

RELATED APPLICATIONS

This application is a United States National Stage Application filed under 35 U.S.C 371 of PCT Patent Application Serial No. PCT/CN2014/084682, filed Aug. 19, 2014, which claims Chinese Patent Application Serial No. CN201310655598.3, filed Dec. 6, 2013, the disclosure of all of which are hereby incorporated by reference in their entirety.

TECHNICAL FIELD

The present disclosure relates to the technical field of semiconductor manufacture, and in particular, to a self-calibration apparatus and a self-calibration method for real-time temperature measurement system of a MOCVD device.

BACKGROUND OF THE INVENTION

A growth temperature of an epitaxial wafer is a key parameter for controlling production performance of MOCVD. Due to strict reaction conditions of MOCVD, it requires a high vacuum, high temperature, chemically active growth environment, a high-speed rotating substrate, and strict space arrangement of equipment. For that reason, techniques which directly measure a temperature, such as thermocouples, are almost impossible to be used. Therefore, it is necessary to use a non-contact temperature measurement method to measure the growth temperature of the epitaxial wafer. The non-contact temperature measurement method applied in the prior art is a high temperature measurement method which is corrected through a thermal radiation coefficient, and in which a temperature of a surface of an epitaxial wafer is calculated by measuring radiation light of a certain wave band and an emissivity of the surface of the corresponding epitaxial wafer. However, during the growth of the epitaxial wafer, an installation of a temperature measurement system and external environment will affect the stability of the temperature measurement thereof. The influencing factors mainly include: a) the influence of deposition on a window of a reaction chamber; b) the influence of an installation position of the temperature measurement system on a change of the detection distance and a change of a solid angle of an optical detector; c) the influence of the epitaxial wafer growth environment such as a ventilation pressure and the rotary transformation of a graphite disk. These influences will change signals detected by the temperature measurement system, causing a systematic temperature deviation, thereby resulting in uniformity and inaccuracy in the measurement of the growth temperature of the epitaxial wafer.

SUMMARY OF THE INVENTION

In order to solve the above problems, the present disclosure provides a self-calibration apparatus and method for a real-time temperature measurement system of a MOCVD device with a dual-wavelength temperature measurement structure.

The self-calibration apparatus for a real-time temperature measurement system of a MOCVD device according to the present disclosure may comprise a MOCVD reaction chamber and an optical detector. The MOCVD reaction chamber includes an epitaxial wafer, and a detection window is provided on the top of the MOVCD reaction chamber, and the light detector emits detection light beams whose wavelengths are respectively $\lambda_1$ and $\lambda_2$ toward the epitaxial wafer through the detection window, and the detection light beams are reflected by the epitaxial wafer to form reflected light beams which are detected by the optical detector.

The self-calibration method based on the self-calibration apparatus for a real-time temperature measurement system of a MOCVD device according to the present disclosure may comprise:

measuring response spectrums $P(\lambda, T)$ of a black-body furnace at different temperatures;

calculating a ratio $r_0(T)$ of theoretical thermal radiation powers respectively corresponding to a first wavelength $\lambda_1$ and a second wavelength $\lambda_2$ $$r_0(T) = \frac{P_0(\lambda_1, T)}{P_0(\lambda_2, T)} = \frac{\int_{\lambda_1-\Delta\lambda_1}^{\lambda_1+\Delta\lambda_1} f_1(\lambda)g_1(\lambda)P(\lambda, T)/\tau(T)d\lambda}{\int_{\lambda_2-\Delta\lambda_2}^{\lambda_2+\Delta\lambda_2} f_2(\lambda)g_2(\lambda)P(\lambda, T)/\tau(T)d\lambda}$$

according to the following formulas:

$$P_0(\lambda_1,T)=\int_{\lambda_1-\Delta\lambda_1}^{\lambda_1+\Delta\lambda_1} f_1(\lambda)g_1(\lambda)P(\lambda,T)/\tau(T)d\lambda$$

$$P_0(\lambda_2,T)=\int_{\lambda_2-\Delta\lambda_2}^{\lambda_2+\Delta\lambda_2} f_2(\lambda)g_2(\lambda)P(\lambda,T)/\tau(T)d\lambda$$

where, $P_0(\lambda_1, T)$ indicates a thermal radiation power corresponding to the first wavelength $\lambda_1$, $\lambda_1$ indicates the first wavelength, $\Delta\lambda_1$ indicates a bandwidth corresponding to the first wavelength $\lambda_1$, $f_1(\lambda)$ indicates a response function of an optical detector (6) at the first wavelength $\lambda_1$, $g_1(\lambda)$ indicates a transmittance of a radiation light corresponding to the first wavelength $\lambda_1$ in an optical device, $P(\lambda, T)$ indicates a response spectrum of the black-body furnace, $\tau(T)$ indicates an expression of a spectral transmission curve, $P_0(\lambda_2, T)$ indicates a thermal radiation power corresponding to the second wavelength $\lambda_2$, $\lambda_2$ indicates the second wavelength, $\Delta\lambda_2$ indicates a bandwidth corresponding to the second wavelength $\lambda_2$, $f_2(\lambda)$ indicates a response function of the optical detector (6) at the second wavelength $\lambda_2$, $g_2(\lambda)$ indicates a transmittance of a radiation light corresponding to the second wavelength $\lambda_2$ in an optical device, T indicates a temperature, $r_0(T)$ indicates a ratio of theoretical thermal radiation powers respectively corresponding to the first wavelength $\lambda_1$ and the second wavelength $\lambda_2$;

performing a least square fitting according to the temperatures and the ratios $r_0(T)$ of corresponding theoretical thermal radiation powers to obtain a theoretical thermal radiation ratio-temperature curve;

measuring actual thermal radiation powers corresponding to the first wavelength $\lambda_1$ and actual thermal radiation powers corresponding to the second wavelength $\lambda_2$ at different temperatures, and obtaining actual thermal radiation ratios;

depicting points corresponding to the actual thermal radiation ratios on the theoretical thermal radiation ratio-temperature curve according to the actual thermal radiation ratios;

substituting values of the temperatures T corresponding to the points into the following formulas to obtain $m_1$ and $m_2$ respectively:

$$L(\lambda_1, T) = m_1 \times \int_{\lambda_1-\Delta\lambda_1}^{\lambda_1+\Delta\lambda_1} f_1(\lambda)g_1(\lambda)\varepsilon(\lambda) \times \frac{2\pi hc^2/\lambda^5}{\exp\left(\frac{hc}{kT\lambda}\right)-1} d\lambda$$

$$L(\lambda_2, T) = m_2 \times \int_{\lambda_2-\Delta\lambda_2}^{\lambda_2+\Delta\lambda_2} f_2(\lambda)g_2(\lambda)\varepsilon(\lambda) \times \frac{2\pi hc^2/\lambda^5}{\exp\left(\frac{hc}{kT\lambda}\right)-1} d\lambda$$

where, $L(\lambda_1, T)$ indicates an actual thermal radiation power corresponding to the first wavelength $\lambda_1$, $L(\lambda_2, T)$ indicates an actual thermal radiation power corresponding to the second wavelength $\lambda_2$, $m_1$ indicates a calibration coefficient corresponding to the first wavelength $\lambda_1$, $m_2$ indicates a calibration coefficient corresponding to the second wavelength $\lambda_2$, $f_1(\lambda)$ indicates a response function of the optical detector (6) at the first wavelength $\lambda_1$, $g_1(\lambda)$ indicates a transmittance of a radiation light corresponding to the first wavelength $\lambda_1$ in an optical device, $f_2(\lambda)$ indicates a response function of the optical detector (6) at the second wavelength $\lambda_2$, $g_2(\lambda)$ indicates a transmittance of a radiation light corresponding to the second wavelength $\lambda_2$ in an optical device, $\varepsilon(\lambda)$ indicates an emissivity of a surface of the epitaxial wafer (4), T indicates a temperature, $\lambda_1$ indicates the first wavelength, $\Delta\lambda_1$ indicates a bandwidth corresponding to the first wavelength $\lambda_1$, $\lambda_2$ indicates the second wavelength, $\Delta\lambda_2$ indicates a bandwidth corresponding to the second wavelength $\lambda_2$, k indicates Boltzmann constant, $k=1.3806\times10^{-23}$ J/K, h indicates Planck constant, $h=6.626\times10^{-34}$ J·s, c indicates a speed of light in vacuum, $c=3\times10^8$ m/s.

The self-calibration apparatus and method for real-time temperature measurement system of a MOCVD device according to by the disclosure can obtain calibration coefficients $m_1$ and $m_2$ respectively corresponding to the first wavelength $\lambda_1$ and the second wavelength $\lambda_2$ in a dual-wavelength temperature measurement structure, thereby realizing self-calibration of the real-time temperature measurement system of a MOCVD device, thus ensuring consistent and accurate measurements of the growth temperature of the epitaxial wafer.

DETAILED DESCRIPTION OF THE INVENTION

The present invention will be described in detail below in conjunction with the drawings and specific embodiments in order for an in-depth understanding of the invention.

Figure 1:
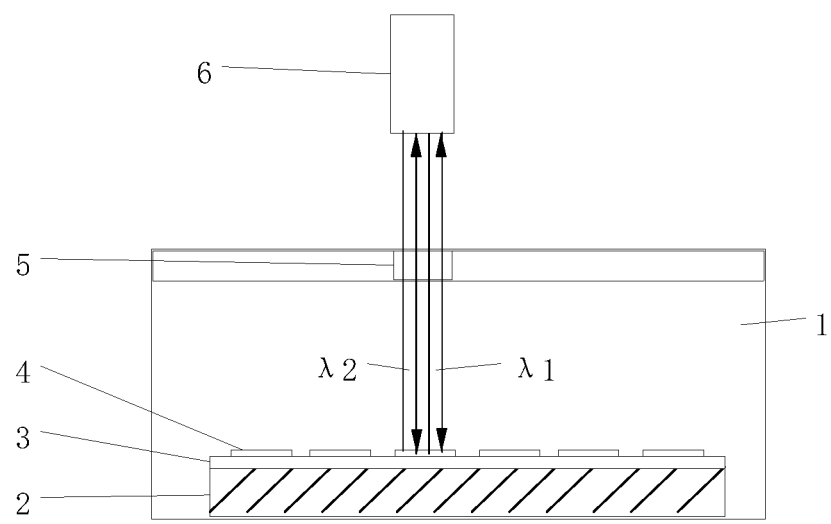
FIG. 1 is a schematic structural diagram of a self-calibration apparatus for a real-time temperature measurement system of a MOCVD device according to an embodiment of the present disclosure.
Figure 2:
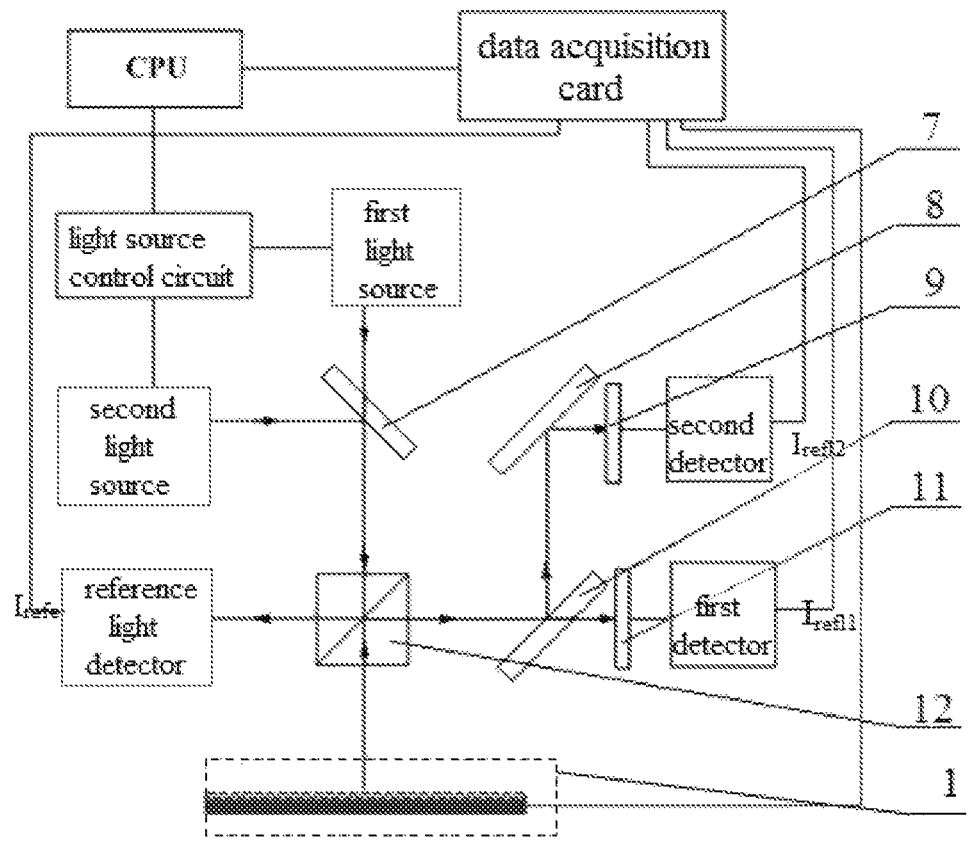
FIG. 2 is a schematic structural diagram of an optical detector in a self-calibration apparatus for a real-time temperature measurement system of a MOCVD device according to an embodiment of the present disclosure.

Referring to FIGS. 1 and 2, a self-calibration apparatus for a real-time temperature measurement system of a MOCVD device comprises a MOCVD reaction chamber 1 and an optical detector 6. The MOCVD reaction chamber 1 includes an epitaxial wafer 4, and a top of the MOCVD reaction chamber 1 is provided with a detection window 5. The optical detector 6 emits detection light beams whose wavelengths are respectively $\lambda_1$ and $\lambda_2$ toward the epitaxial wafer 4 through the detection window 5, and the detection light beams are reflected by the epitaxial wafer 4 to form reflected light beams which are detected by the optical detector.

As an implementation of the MOCVD reaction chamber 1, the MOCVD reaction chamber 1 further comprises a heating chamber 2 and a graphite susceptor 3. The graphite susceptor 3 is used to bear the epitaxial wafer 4. The heating chamber 2 is used to heat the graphite susceptor 3 and in turn heat the epitaxial wafer 4.

Referring to FIG. 2, as a specific implementation of the optical detector 6, the optical detector 6 includes a first light source, a second light source, a beam splitter, a first dichroic mirror 10, a first filter 11, and a first detector, a second dichroic mirror 8, a second filter 9, a second detector, a reference light detector, and a data acquisition unit (in this embodiment, the data acquisition unit is a data acquisition card).

The first light source emits a light beam of wavelength $\lambda_1$, and the second light source emits a light beam of wavelength $\lambda_2$. The light beam of wavelength $\lambda_1$ and the light beam of wavelength $\lambda_2$ are split into two parts after passing through the beam splitter, one part being a reference light, the other part being a detection light beam of wavelength $\lambda_1$ and a detection light beam of wavelength $\lambda_2$. The reference light enters a reference light detector to form an electrical signal $I_{refe}$.

The detection light beam of the wavelength $\lambda_1$ and the detection light beam of the wavelength $\lambda_2$ are reflected by the epitaxial wafer 4 to form reflected lights, and the reflected lights, after passing through the beam splitter 12, are separated into two parts by the first dichroic mirror and the second dichroic mirror. One part has a wavelength $\lambda_1$, passing through the first filter and then entering the first detector to form an electrical signal $I_{refl1}$; the other part has a wavelength $\lambda_2$, passing through the second filter and then entering the second detector to form an electrical signal $I_{refl2}$.

The electrical signals $I_{refe}$, $I_{refl1}$, and $I_{refl2}$ are respectively acquired by the data acquisition unit.

In some embodiments, a frequency of a light emitted by the first light source and the second light source is modulatable, and because there is $\lambda \cdot f = c$, where $\lambda$ is wavelength, f is frequency, and c is speed of light, the wavelength of the light emitted by the first light source and the second light source can be controlled by controlling the frequency.

In some embodiments, the optical detector 6 further includes a light source control circuit for controlling on and off of the first light source and the second light source. When the first light source and the second light source are turned on, a sum of a reflected light intensity and a thermal radiation intensity of the epitaxial wafer 4 is detected; when the first light source and the second light source are turned off, the thermal radiation intensity of the epitaxial wafer 4 may be detected. The reflected light intensity and the thermal radiation intensity are obtained respectively through a separation algorithm, thereby a reflectivity and a temperature of a surface of the epitaxial wafer 4 can be calculated.

In some embodiments, the optical detector 6 further includes a processing unit, and the processing unit is configured to process the light source control circuit and the data acquisition unit. The processing unit may be a CPU, which can be replaced by a single chip microcomputer, a PLC, or the like.

Figures 3, 4:
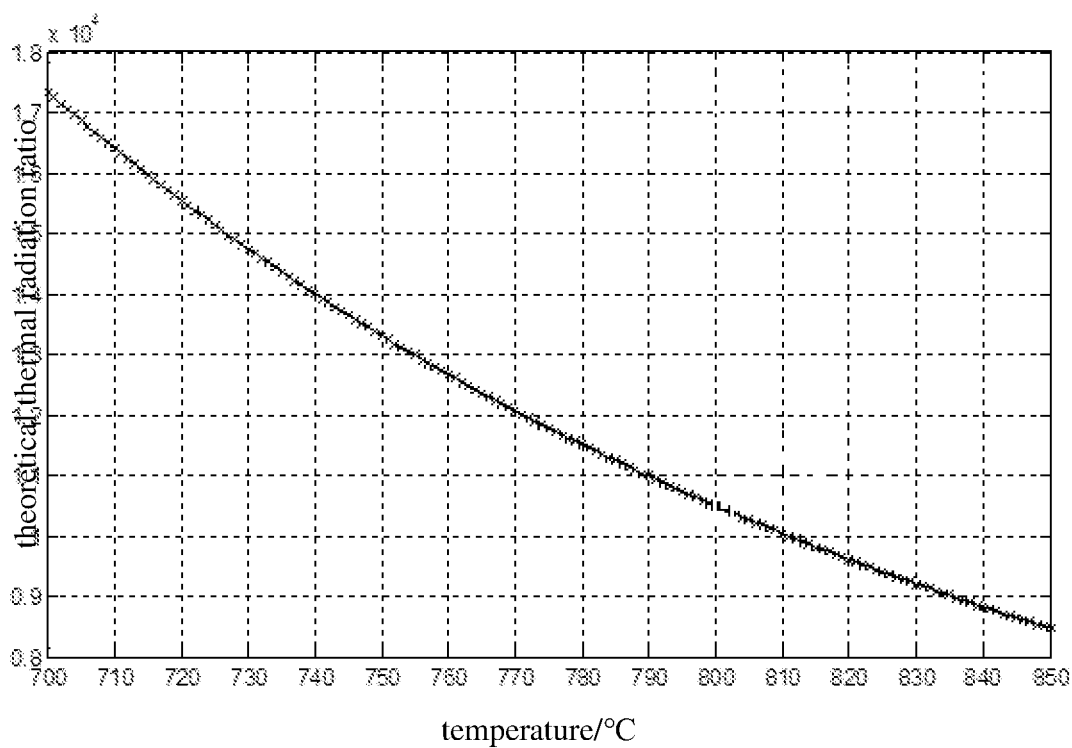
FIG. 3 is a flowchart of a self-calibration method according to an embodiment of the present disclosure based on a self-calibration apparatus for a real-time temperature measurement system of a MOCVD device according to an embodiment of the present disclosure.
FIG. 4 is a diagram showing a theoretical thermal radiation ratio-temperature curve in a self-calibration method based on a self-calibration apparatus for a real-time temperature measurement system of a MOCVD device according to an embodiment of the present disclosure.

Referring to FIG. 3, a self-calibration method based on a self-calibration apparatus for a real-time temperature measurement system of a MOCVD device according to embodiments of the present disclosure includes the following steps:

Step 1: depicting points corresponding to actual thermal radiation ratios on the theoretical thermal radiation ratio-temperature curve shown in FIG. 4 according to the actual thermal radiation ratios;

Step 2: Substituting values of the temperatures T corresponding to the points into the following equation $$L(\lambda_1, T) = m_1 \times \int_{\lambda_1 - \Delta\lambda_1}^{\lambda_1 + \Delta\lambda_1} f_1(\lambda) g_1(\lambda) \varepsilon(\lambda) \times \frac{2\pi hc^2/\lambda^5}{\exp\left(\frac{hc}{kT\lambda}\right) - 1} d\lambda$$

$$L(\lambda_2, T) = m_2 \times \int_{\lambda_2 - \Delta\lambda_2}^{\lambda_2 + \Delta\lambda_2} f_2(\lambda) g_2(\lambda) \varepsilon(\lambda) \times \frac{2\pi hc^2/\lambda^5}{\exp\left(\frac{hc}{kT\lambda}\right) - 1} d\lambda$$

to obtain $m_1$ and $m_2$ respectively, where, $L(\lambda_1, T)$ indicates an actual thermal radiation power corresponding to the first wavelength $\lambda_1$, $L(\lambda_2, T)$ indicates a an actual thermal radiation power corresponding to the second wavelength $\lambda_2$, $m_1$ indicates a calibration coefficient corresponding to the first wavelength $\lambda_1$, $m_2$ indicates a calibration coefficient corresponding to the second wavelength $\lambda_2$, $f_1(\lambda)$ indicates a response function of the optical detector 6 at the first wavelength $\lambda_1$, $g_1(\lambda)$ indicates a transmittance of a radiation light corresponding to the first wavelength $\lambda_1$ in an optical device, $f_2(\lambda)$ indicates a response function of the optical detector 6 at the second wavelength $\lambda_2$, $g_2(\lambda)$ indicates a transmittance of a radiation light corresponding to the second wavelength $\lambda_2$ in an optical device, $\varepsilon(\lambda)$ indicates an emissivity of a surface of the epitaxial wafer (4), T indicates a temperature, $\lambda_1$ indicates the first wavelength, $\Delta\lambda_1$ indicates a bandwidth corresponding to the first wavelength $\lambda_1$, $\lambda_2$ indicates a second wavelength, $\Delta\lambda_2$ indicates a bandwidth corresponding to the second wavelength $\lambda_2$, k indicates Boltzmann constant, $k = 1.3806 \times 10^{-23}$ J/K, h indicates Planck constant, $h = 6.626 \times 10^{-34}$ J·s, c indicates a speed of light in vacuum, $c = 3 \times 10^8$ m/s.

In some embodiments, a method for generating the theoretical thermal radiation ratio-temperature curve of FIG. 4 includes the following steps:

Step 1: measuring response spectrums of a black-body furnace at different temperatures;

Step 2: calculating a ratio $r_0(T)$ of the theoretical thermal radiation powers respectively corresponding to the first wavelength $\lambda_1$ and the second wavelength $\lambda_2$, $$r_0(T) = \frac{P_0(\lambda_1, T)}{P_0(\lambda_2, T)} = \frac{\int_{\lambda_1 - \Delta\lambda_1}^{\lambda_1 + \Delta\lambda_1} f_1(\lambda) g_1(\lambda) P(\lambda, T)/\tau(T) d\lambda}{\int_{\lambda_2 - \Delta\lambda_2}^{\lambda_2 + \Delta\lambda_2} f_2(\lambda) g_2(\lambda) P(\lambda, T)/\tau(T) d\lambda}$$

according to the following equations $$P_0(\lambda_1, T) = \int_{\lambda_1 - \Delta\lambda_1}^{\lambda_1 + \Delta\lambda_1} f_1(\lambda) g_1(\lambda) P(\lambda, T)/\tau(T) d\lambda$$

$$P_0(\lambda_2, T) = \int_{\lambda_2 - \Delta\lambda_2}^{\lambda_2 + \Delta\lambda_2} f_2(\lambda) g_2(\lambda) P(\lambda, T)/\tau(T) d\lambda$$

where, $P_0(\lambda_1, T)$ indicates a thermal radiation power corresponding to the first wavelength $\lambda_1$, $\lambda_1$ indicates the first wavelength, $\Delta\lambda_1$ indicates a bandwidth corresponding to the first wavelength $\lambda_1$, $f_1(\lambda)$ indicates a response function of the optical detector 6 at the first wavelength $\lambda_1$, $g_1(\lambda)$ indicates a transmittance of a radiation light corresponding to the first wavelength $\lambda_1$ in an optical device, $P(\lambda, T)$ indicates a response spectrum of the black-body furnace, $\tau(T)$ indicates an expression of a spectral transmission curve, $P_0(\lambda_2, T)$ indicates a thermal radiation power corresponding to the second wavelength $\lambda_2$, $\lambda_2$ indicates the second wavelength, $\Delta\lambda_2$ indicates a bandwidth corresponding to the second wavelength $\lambda_2$, $f_2(\lambda)$ indicates a response function of the optical detector 6 at the second wavelength $\lambda_2$, $g_2(\lambda)$ indicates a transmittance of the radiation light corresponding to the second wavelength $\lambda_2$ in an optical device, T indicates a temperature, $r_0(T)$ indicates a ratio of theoretical thermal radiation powers respectively corresponding to the first wavelength $\lambda_1$ and the second wavelength $\lambda_2$;

Step 3: performing a least square fitting according to the temperatures and the ratios $r_0(T)$ of corresponding theoretical thermal radiation powers to obtain a theoretical thermal radiation ratio-temperature curve.

In some embodiments, when the thermal radiation ratio-temperature curve shown in FIG. 4 is obtained by least square method, there are a plurality of thermal radiation ratios and the corresponding temperatures T participating in the fitting, obtained respectively when the temperature of the reaction chamber is stable at $T_1, T_2, \ldots, T_n$, where $T_1, T_2, \ldots, T_n$ are respectively obtained by heating by a black-body furnace heating system.

In some embodiments, a temperature measurement range $(T_{min}, T_{max})$ is (400° C., 1500° C.), and the first wavelength $\lambda_1$ corresponds to a high temperature interval $(T_{up}, T_{max})$, and the second wavelength $\lambda_2$ corresponds to a low temperature interval $(T_{min}, T_{down})$.

In some embodiments, $(T_{min}, T_{max})$ may be (450° C., 1200° C.), $T_{up}$=750° C., $T_{down}$=800° C., $\lambda_1$=940 nm, $\lambda_2$=1050 nm.

In some embodiments, the actual thermal radiation ratios r(T) may be calculated as follows:

$$r(T) = \frac{L(\lambda_1, T)/\varepsilon_1}{L(\lambda_2, T)/\varepsilon_2}$$

where, $L(\lambda_1, T)$ indicates an actual thermal radiation power corresponding to the first wavelength $\lambda_1$, $L(\lambda_2, T)$ indicates a an actual thermal radiation power corresponding to the second wavelength $\lambda_2$, $\lambda_1$ indicates the first wavelength, $\lambda_2$ indicates the second wavelength, $\varepsilon_1$ indicates an emissivity of a surface of the epitaxial wafer 4 corresponding to the first wavelength $\lambda_1$, $\varepsilon_2$ indicates an emissivity of the surface of the epitaxial wafer 4 corresponding to the second wavelength $\lambda_2$, and T indicates temperature.

In some embodiments, when the epitaxial wafer 4 is an ideal opaque, smooth, flat surface, $$\varepsilon = 1 - R/\Delta T_R$$

where, $\varepsilon$ indicates an emissivity of the surface of the epitaxial wafer 4, R indicates a reflectivity of the epitaxial wafer 4, and $\Delta T_R$ indicates a reflectivity attenuation factor.

When the epitaxial wafer 4 is a transparent, single-side polished sapphire substrate, $$\varepsilon = \varepsilon_{carr}(1-R/\Delta T_R)(1-R_{diff})\{1+R/\Delta T_R * R_{diff} + (1-\varepsilon_{carr})[(R_{diff}+R/\Delta T_R(1-R_{diff})^2)]\}$$

where, $\varepsilon$ indicates an emissivity of the surface of the epitaxial wafer 4, $R_{diff}$ indicates a scattering rate of a non-smooth substrate, $\varepsilon_{carr}$ indicates the thermal emissivity of the graphite susceptor 3, and $\Delta T_R$ indicates a reflectivity attenuation factor.

When the actual thermal radiation ratios are calculated, the temperatures T can be obtained by heating by the MOCVD reaction chamber 1.

The self-calibration apparatus and method for real-time temperature measurement system of a MOCVD device according to the present disclosure can obtain calibration coefficients $m_1$ and $m_2$ respectively corresponding to the first wavelength $\lambda_1$ and the second wavelength $\lambda_2$ in a dual-wavelength temperature measurement structure, thereby realizing self-calibration of the real-time temperature measurement system of a MOCVD device, ensuring consistent and accurate measurements of the growth temperatures of the epitaxial wafer 4.

Generally, specific values of the two constants $m_1$ and $m_2$, or in other words, the intensities of thermal radiation signals are greatly affected by the growth environment of the epitaxial wafer and the systematic parameters, such as an angle of a detector, a transmittance of a window of a reaction chamber, and a reflection signal of a wall of the reaction chamber, as well as a placement position of the epitaxial wafer, and the like. Changes in these parameters can result in different data read by the detector. However, a ratio of thermal radiation intensities of two wavelengths is independent from changes of these parameters, and therefore, the temperature of the epitaxial wafer determined by the ratio of thermal radiation intensities also excludes the effects of these factors.

In some embodiments, with the self-calibration apparatus and method for a real-time temperature measurement system of a MOCVD device according to the present disclosure, a temperature of the MOCVD reaction chamber 1 can also be measured. After the calibration coefficients $m_1$ and $m_2$ having been obtained, when the temperature of the MOCVD reaction chamber 1 is in a low temperature interval, the actual thermal radiation powers $(\lambda_1, T)$ corresponding to the first wavelength $\lambda_1$ are measured and the temperature of the MOCVD reaction chamber 1 is calculated according to the formula:

$$L(\lambda_1, T) = m_1 \times \int_{\lambda_1-\Delta\lambda_1}^{\lambda_1+\Delta\lambda_1} f_1(\lambda)g_1(\lambda)\varepsilon(\lambda) \times \frac{2\pi hc^2/\lambda^5}{\exp\left(\frac{hc}{kT\lambda}\right)-1} d\lambda;$$

when the MOCVD reaction chamber 1 is in a high temperature interval, the actual thermal radiation powers $L(\lambda_2, T)$ corresponding to the second wavelength $\lambda_2$ are measured and the temperature of the MOCVD reaction chamber 1 is calculated according to the formula:

$$L(\lambda_2, T) = m_2 \times \int_{\lambda_2-\Delta\lambda_2}^{\lambda_2+\Delta\lambda_2} f_2(\lambda)g_2(\lambda)\varepsilon(\lambda) \times \frac{2\pi hc^2/\lambda^5}{\exp\left(\frac{hc}{kT\lambda}\right)-1} d\lambda;$$

where, $L(\lambda_1, T)$ indicates an actual thermal radiation power corresponding to the first wavelength $\lambda_1$, $L(\lambda_2, T)$ indicates an actual thermal radiation power corresponding to the second wavelength $\lambda_2$, $m_1$ indicates a calibration coefficient corresponding to the first wavelength $\lambda_1$, $m_2$ indicates a calibration coefficient corresponding to the second wavelength $\lambda_2$, $f_1(\lambda)$ indicates a response function of the optical detector 6 at the first wavelength $\lambda_1$, $g_1(\lambda)$ indicates a transmittance of a radiation light corresponding to the first wavelength $\lambda_1$ in an optical device, $f_2(\lambda)$ indicates a response function of the optical detector 6 at the second wavelength $\lambda_1$, $g_2(\lambda)$ indicates a transmittance of the radiation light corresponding to the second wavelength $\lambda_1$ in an optical device, ε(λ) indicates an emissivity of a surface of the epitaxial wafer 4, T indicates temperature;

$\lambda_1$ indicates the first wavelength, $\Delta\lambda_1$ indicates a bandwidth corresponding to the first wavelength $\lambda_1$, $\lambda_2$ indicates the second wavelength, $\Delta\lambda_2$ indicates a bandwidth corresponding to the second wavelength $\lambda_2$, k indicates Boltzmann constant, k=1.3806×10$^{-23}$ J/K, h indicates a Planck constant, h=6.626×10$^{-34}$ J·s, and c indicates a speed of light in vacuum, c=3×10$^8$ m/s.

In some embodiments, when $T_{min}<T_{up}<T_{down}<T_{max}$, there is a transition interval, in which the temperature of the MOCVD reaction chamber can be measured respectively under the condition of the first wavelength $\lambda_1$ and the condition of the second wavelength $\lambda_2$. When the real-time temperature measurement method for the MOCVD reaction chamber according to the present disclosure is used to measure a temperature in a transition temperature interval, a smoothing algorithm can be used to obtain an actual temperature value. In the transition temperature interval, the temperature $T_{low}$ of the MOCVD reaction chamber in a low temperature interval can be measured under the condition of the first wavelength $\lambda_1$, and the temperature $T_{high}$ of the MOCVD reaction chamber in a high temperature interval can be measured under the condition of the second wavelength $\lambda_2$. Since the temperature $T_{high}$ is different from the temperature $T_{low}$, at this time, the smoothing algorithm can be used to calculate the actual temperature of the MOCVD reaction chamber. For example, a single smoothing algorithm $$T = T_{high} \times \frac{T_{low} - T_{up}}{T_{down} - T_{up}} + T_{low} \times \left(1 - \frac{T_{low} - T_{up}}{T_{down} - T_{up}}\right)$$

can be used to calculate the actual temperature of the MOCVD reaction chamber. Therefore, the real-time temperature measurement method for the MOCVD reaction chamber according to the present invention has a wide range of application.

The temperature of the MOCVD reaction chamber 1 measured in this manner is much closer to an actual temperature.

The objects, the technical solutions and the advantageous effects of the invention have been described in detail with reference to the above specific embodiments. It should be appreciated that the above embodiments are merely specific embodiments, but not intended to limit the invention. Any modifications, equivalent substitutions, improvements, etc., made within the spirit and principle of the invention should all be included within the scope of the invention.

The invention claimed is:

1. A self-calibration apparatus for a real-time temperature measurement system of a MOCVD device, comprising a MOCVD reaction chamber (1) and an optical detector (6), wherein the MOCVD reaction chamber (1) includes an epitaxial wafer (4), and a detection window (5) is provided on the top of the MOVCD reaction chamber (1), and the light detector (6) emits detection light beams whose wavelengths are respectively $\lambda_1$ and $\lambda_2$ toward the epitaxial wafer (4) through the detection window (5), and the detection light beams are reflected by the epitaxial wafer (4) to form reflected light beams which are detected by the optical detector, wherein the optical detector (6) comprises a first light source, a second light source, a beam splitter, a first dichroic mirror (10), a first filter (11), and a first detector, a second dichroic mirror (8), a second filter (9), a second detector, a reference light detector, and a data acquisition unit;

the first light source emits a light beam of wavelength $\lambda_1$, and the second light source emits a light beam of wavelength $\lambda_2$; the light beam of wavelength $\lambda_1$ and the light beam of wavelength $\lambda_2$, after passing through the beam splitter (12), are split into two parts, one part being a reference light, the other part being a detection light beam of wavelength $\lambda_1$ and a detection light beam of wavelength $\lambda_2$; the reference light enters a reference light detector to form an electrical signal $I_{refe}$, the detection light beam of the wavelength $\lambda_1$ and the detection light beam of the wavelength $\lambda_2$ are reflected by the epitaxial wafer (4) to form reflected lights, and the reflected lights, after passing through the beam splitter (12), are separated into two parts by the first dichroic mirror and the second dichroic mirror, wherein one part has a wavelength $\lambda_1$, passing through the first filter and then entering the first detector to form an electrical signal $I_{refl1}$; the other part has a wavelength 2, passing through the second filter and then entering the second detector to form an electrical signal $I_{refl2}$; and the electrical signals $I_{refe}$, $I_{refl1}$, and $I_{refl2}$ are respectively acquired by the data acquisition unit.

2. The apparatus of claim 1, wherein the MOCVD reaction chamber (1) further comprises a heating chamber (2) and a graphite susceptor (3), the graphite susceptor (3) being used to bear the epitaxial wafer (4), the heating chamber (2) being used to heat the graphite susceptor (3) and in turn heat the epitaxial wafer (4).

3. The apparatus of claim 1, wherein a frequency of a light emitted by the first light source and the second light source is modulatable.

4. The apparatus of claim 1, further comprising a light source control circuit for controlling the light emitted by the first light source and the second light source.

5. The apparatus of claim 1, further comprising a processing unit, and the processing unit is configured to process the light source control circuit and the data acquisition unit.

6. A self-calibration method based on the self-calibration apparatus for a real-time temperature measurement system of a MOCVD device of claim 1, comprising:

measuring response spectrums P(λ, T) of a black-body furnace at different temperatures;

calculating a ratio $r_0(T)$ of theoretical thermal radiation powers respectively corresponding to a first wavelength $\lambda_1$ and a second wavelength $\lambda_2$ $$r_0(T) = \frac{P_0(\lambda_1, T)}{P_0(\lambda_2, T)} = \frac{\int_{\lambda_1-\Delta\lambda_1}^{\lambda_1+\Delta\lambda_1} f_1(\lambda)g_1(\lambda)P(\lambda, T)/\tau(T)d\lambda}{\int_{\lambda_2-\Delta\lambda_2}^{\lambda_2+\Delta\lambda_2} f_2(\lambda)g_2(\lambda)P(\lambda, T)/\tau(T)d\lambda}$$

according to the following formulas:

$$P_0(\lambda_1,T) = \int_{\lambda_1-\Delta\lambda_1}^{\lambda_1+\Delta\lambda_1} f_1(\lambda)g_1(\lambda)P(\lambda,T)/\tau(T)d\lambda$$

$$P_0(\lambda_2,T) = \int_{\lambda_2-\Delta\lambda_2}^{\lambda_2+\Delta\lambda_2} f_2(\lambda)g_2(\lambda)P(\lambda,T)/\tau(T)d\lambda$$

where, $P_0(\lambda_1, T)$ indicates a thermal radiation power corresponding to the first wavelength $\lambda_1$, $\lambda_1$ indicates the first wavelength, $\Delta\lambda_1$ indicates a bandwidth corresponding to the first wavelength $\lambda_1$, $f_1(\lambda)$ indicates a response function of the optical detector 6 at the first wavelength $\lambda_1$, $g_1(\lambda)$ indicates a transmittance of a radiation light corresponding to the first wavelength $\lambda_1$ in an optical device, $P(\lambda, T)$ indicates a response spectrum of the black-body furnace, $\tau(T)$ indicates an expression of a spectral transmission curve, $P_0(\lambda_2, T)$ indicates a thermal radiation power corresponding to the second wavelength $\lambda_2$, $\lambda_2$ indicates the second wavelength, $\Delta\lambda_2$ indicates a bandwidth corresponding to the second wavelength $\lambda_2$, $f_2(\lambda)$ indicates a response function of the optical detector (6) at the second wavelength $\lambda_2$, $g_2(\lambda)$ indicates a transmittance of the radiation light corresponding to the second wavelength $\lambda_2$ in an optical device, T indicates a temperature, $r_0(T)$ indicates a ratio of theoretical thermal radiation powers respectively corresponding to the first wavelength $\lambda_1$ and the second wavelength $\lambda_2$;

performing a least square fitting according to the temperatures and the ratios $r_0(T)$ of corresponding theoretical thermal radiation powers to obtain a theoretical thermal radiation ratio-temperature curve;

measuring actual thermal radiation powers corresponding to the first wavelength $\lambda_1$ and actual thermal radiation powers corresponding to the second wavelength $\lambda_2$ at different temperatures, and obtaining actual thermal radiation ratios;

depicting points corresponding to the actual thermal radiation ratios on the theoretical thermal radiation ratio-temperature curve according to the actual thermal radiation ratios;

substituting values of the temperatures T corresponding to the points into the following formulas to obtain $m_1$ and $m_2$ respectively:

$$L(\lambda_1, T) = m_1 \times \int_{\lambda_1-\Delta\lambda_1}^{\lambda_1+\Delta\lambda_1} f_1(\lambda)g_1(\lambda)\varepsilon(\lambda) \times \frac{2\pi hc^2/\lambda^5}{\exp\left(\frac{hc}{kT\lambda}\right)-1} d\lambda$$

$$L(\lambda_2, T) = m_2 \times \int_{\lambda_2-\Delta\lambda_2}^{\lambda_2+\Delta\lambda_2} f_2(\lambda)g_2(\lambda)\varepsilon(\lambda) \times \frac{2\pi hc^2/\lambda^5}{\exp\left(\frac{hc}{kT\lambda}\right)-1} d\lambda$$

where, $L(\lambda_1, T)$ indicates an actual thermal radiation power corresponding to the first wavelength $\lambda_1$, $L(\lambda_2, T)$ indicates an actual thermal radiation power corresponding to the second wavelength $\lambda_2$, $m_1$ indicates a calibration coefficient corresponding to the first wavelength $\lambda_1$, $m_2$ indicates a calibration coefficient corresponding to the second wavelength $\lambda_2$, $f_1(\lambda)$ indicates a response function of the optical detector (6) at the first wavelength $\lambda_1$, $g_1(\lambda)$ indicates a transmittance of a radiation light corresponding to the first wavelength $\lambda_1$ in an optical device, $f_2(\lambda)$ indicates a response function of the optical detector (6) at the second wavelength $\lambda_1$, $g_2(\lambda)$ indicates a transmittance of the radiation light corresponding to the second wavelength $\lambda_1$ in an optical device, $\varepsilon(\lambda)$ indicates an emissivity of a surface of the epitaxial wafer (4), T indicates temperature;

$\lambda_1$ indicates the first wavelength, $\Delta\lambda_1$ indicates a bandwidth corresponding to the first wavelength $\lambda_1$, $\lambda_2$ indicates the second wavelength, $\Delta\lambda_2$ indicates a bandwidth corresponding to the second wavelength $\lambda_2$, k indicates Boltzmann constant, $k=1.3806\times10^{-23}$ J/K, h indicates a Planck constant, $h=6.626\times10^{-34}$ J·s, and c indicates a speed of light in vacuum, $c=3\times10^8$ m/s.

7. The method of claim 6, wherein when the thermal radiation ratio-temperature curve is obtained by least square method, there are a plurality of thermal radiation ratios and corresponding temperatures T participating in the fitting, obtained respectively when the temperature of the reaction chamber is stable at $T_1, T_2, \ldots, T_n$.

8. The method of claim 7, wherein $T_1, T_2, \ldots, T_n$ are respectively obtained by heating by a black-body furnace heating system.

9. The method of claim 7, wherein a temperature measurement range $(T_{min}, T_{max})$ is (400° C., 1500° C.); the first wavelength $\lambda_1$ corresponds to a high temperature interval $(T_{up}, T_{max})$, and the second wavelength $\lambda_2$ corresponds to a low temperature interval $(T_{min}, T_{down})$.

10. The method of claim 9, wherein $(T_{min}, T_{max})$ is (450° C., 1200° C.), $T_{up}=750°$ C., $T_{down}=800°$ C., $\lambda_1=940$ nm, $\lambda_2=1050$ nm.

11. The method of claim 6, wherein the actual thermal radiation ratio $r(T)$ is calculated as follows:

$$r(T) = \frac{L(\lambda_1, T)/\varepsilon_1}{L(\lambda_2, T)/\varepsilon_2}$$

where, $L(\lambda_1, T)$ indicates an actual thermal radiation power corresponding to the first wavelength $\lambda_1$, $L(\lambda_2, T)$ indicates an actual thermal radiation power corresponding to the second wavelength $\lambda_2$, $\lambda_1$ indicates the first wavelength, $\lambda_2$ indicates the second wavelength, $\varepsilon_1$ indicates an emissivity of a surface of the epitaxial wafer 4 corresponding to the first wavelength $\lambda_1$, $\varepsilon_2$ indicates an emissivity of the surface of the epitaxial wafer 4 corresponding to the second wavelength $\lambda_2$, and T indicates temperature.

12. The method of claim 11, wherein, when the epitaxial wafer (4) is an ideal opaque, smooth, flat surface, $$\varepsilon = 1 - R/\Delta T_R$$

where, $\varepsilon$ indicates an emissivity of the surface of the epitaxial wafer (4), R indicates a reflectivity of the epitaxial wafer (4), and $\Delta T_R$ indicates a reflectivity attenuation factor;

when the epitaxial wafer (4) is a transparent, single-side polished sapphire substrate, $$\varepsilon = \varepsilon_{carr}(1-R/\Delta T_R)(1-R_{diff})\{1+R/\Delta T_R * R_{diff}+(1-\varepsilon_{carr})[(R_{diff}+R/\Delta T_R(1-R_{diff})^2)]\}$$

where, $\varepsilon$ indicates an emissivity of the surface of the epitaxial wafer (4), $R_{diff}$ indicates a scattering rate of a non-smooth substrate, $\varepsilon_{carr}$ indicates the thermal emissivity of the graphite susceptor (3), and $\Delta T_R$ indicates a reflectivity attenuation factor.

13. The method of claim 11, wherein,
when the actual thermal radiation ratios are calculated, the temperatures T can be obtained by heating by the MOCVD reaction chamber (1).

14. The method of claim 8, wherein a temperature measurement range ($T_{min}$, $T_{max}$) is (400° C., 1500° C.); the first wavelength $\lambda_1$ corresponds to a high temperature interval ($T_{up}$, $T_{max}$), and the second wavelength $\lambda_2$ corresponds to a low temperature interval ($T_{min}$, $T_{down}$).

15. The apparatus of claim 3, further comprising a processing unit, and the processing unit is configured to process the light source control circuit and the data acquisition unit.

16. The apparatus of claim 4, further comprising a processing unit, and the processing unit is configured to process the light source control circuit and the data acquisition unit.

* * * * *